(12) United States Patent
Kimura et al.

(10) Patent No.: US 8,264,469 B2
(45) Date of Patent: Sep. 11, 2012

(54) TOUCH PANEL AND DISPLAY UNIT

(75) Inventors: Kiyohiro Kimura, Miyagi (JP);
Kazuhiro Miura, Miyagi (JP);
Harutoshi Oikawa, Miyagi (JP);
Osamu Sugawara, Miyagi (JP);
Toshinori Kadowaki, Miyagi (JP)

(73) Assignee: Sony Corporation, Tokyo (JP)

( * ) Notice: Subject to any disclaimer, the term of this patent is extended or adjusted under 35 U.S.C. 154(b) by 443 days.

(21) Appl. No.: 12/506,665

(22) Filed: Jul. 21, 2009

(65) Prior Publication Data

US 2010/0026648 A1    Feb. 4, 2010

(30) Foreign Application Priority Data

Jul. 29, 2008   (JP) ................................ 2008-194545

(51) Int. Cl.
*G06F 3/041*    (2006.01)

(52) U.S. Cl. .......... 345/173; 345/174; 345/175; 463/37; 178/18.01; 178/18.02; 178/18.03; 178/19.01; 178/19.02

(58) Field of Classification Search .................. 345/173, 345/174–179; 178/18.01–18.09, 19.01–19.07; 463/37
See application file for complete search history.

(56) References Cited

U.S. PATENT DOCUMENTS

2005/0099402 A1*  5/2005  Nakanishi et al. ............ 345/173
2007/0058258 A1*  3/2007  Mather et al. ................. 359/619

FOREIGN PATENT DOCUMENTS

| JP | 2002-182854 | 6/2002 |
| JP | 2004-234248 | 8/2004 |
| JP | 2004-234271 | 8/2004 |
| JP | 2005-010986 | 1/2005 |
| JP | 2005-158008 | 6/2005 |

OTHER PUBLICATIONS

Japanese Patent Office Action corresponding to Japanese Serial No. 2008-194545 dated May 25, 2010.

* cited by examiner

*Primary Examiner* — Lun-Yi Lao
*Assistant Examiner* — Insa Sadio
(74) *Attorney, Agent, or Firm* — SNR Denton US LLP

(57) ABSTRACT

A touch panel capable of decreasing concavity and convexity generated on the surface and a display unit including the same are provided. The touch panel includes: a first spacer layer on both side faces of a first wiring layer provided on a first transparent substrate; and a second wiring layer on both side faces of a second wiring layer provided on a second transparent substrate. The touch panel also includes a flexible printed circuit board in a gap between the first transparent substrate and the second transparent substrate and in a region including at least part of a region not provided with the adhesion layer in the region opposed to the first wiring layer, the second wiring layer, the first spacer layer, and the second spacer layer.

3 Claims, 9 Drawing Sheets

TOUCH PANEL AND DISPLAY UNIT

BACKGROUND OF THE INVENTION

1. Field of the Invention

The present invention relates to a touch panel detecting the position on the display face of a detection target such as a finger and a pen and a display unit including the touch panel.

2. Description of the Related Art

In the past, a technology of detecting the position where a detection target such as a finger and a pen is contacted with the display face of a display unit has been known. Specially, examples of representative and generally prevailing technologies include a display unit including a touch panel. There are various types of touch panels. Examples of generally prevailing touch panels include a resistive touch panel. In the resistive touch panel, the panel surface has, for example, a laminated structure in which an extremely small spacer is sandwiched between a glass and a film opposed to each other. For the glass and the film, a transparent electrode grating is provided on each face opposed to each other. When a finger or a pen is contacted with the surface of the film, the film is bent, the transparent electrode of the film face and the transparent electrode of the glass face are contacted with each other, and a current is flown. Thus, by measuring a voltage dividing ratio due to resistance of the respective transparent electrodes of the glass face and the film face, the position of the finger or the pen is detected. Therefore, by using such a touch panel, a user is able to intuitively operate the display unit.

FIG. 9 is a perspective view illustrating a schematic configuration of the foregoing resistive touch panel. FIG. 10 is an exploded view of the touch panel of FIG. 9. The touch panel includes, for example, a pair of an upper substrate 110 and a lower substrate 120 arranged oppositely with a certain gap in between. Between the pair of the upper substrate 110 and the lower substrate 120, a flexible printed circuit board (FPC) 130 and an adhesion layer 140 are provided.

The upper substrate 110 has a transparent substrate 111 as a contact face 110A to be contacted with a finger, a pen or the like. On the opposite face (lower face) of the contact face 110A of the transparent substrate 111, a resistive film 112 is provided. Around the resistive film 112 of the lower face of the transparent substrate 111, strip-shaped wiring layers 113A and 113B that are linked to and electrically connected to the resistive film 112 are provided. Each of one end of the wiring layers 113A and 113B is provided in a region opposed to an end portion 130A of the FPC 130, and is contacted with an electrode (not illustrated) of the FPC 130.

The lower substrate 120 has a transparent substrate 121 that supports a resistive film 122 (described later) with which the resistive film 112 is to be contacted when the finger, the pen or the like is contacted with the upper substrate 110. The foregoing resistive film 122 is provided on a face (upper face) opposed to the upper substrate 110 in the transparent substrate 121 and in a region opposed to the resistive film 112. Around the resistive film 122 of the upper face of the transparent substrate 121, strip-shaped wiring layers 123A and 123B that are linked to the resistive film 122 are provided. Each of one end of the wiring layers 123A and 123B is provided in a region opposed to the end portion 130A of the FPC 130, and is contacted with the electrode of the FPC 130.

The adhesion layer 140 is in the shape of a ring having an aperture 140A in a region opposed to the resistive film 112, and is arranged between the wiring layers 113A and 113B on the transparent substrate 111 and the wiring layers 123A and 123B on the transparent substrate 121. Thereby, the adhesion layer 140 insulates the wiring layers 113A and 113B from the wiring layers 123A and 123B, and adheres the upper substrate 110 and the lower substrate 120. The adhesion layer 140 has a notch 140B in a region opposed to the PFC 130, and is not overlapped with the FPC 130 viewed from the thickness direction. The adhesion layer 140 is made of, for example, a double-faced tape.

For a general configuration of the resistive touch panel, for example, a description is also given in Japanese Unexamined Patent Application Publication No. 2002-182854 and the like.

SUMMARY OF THE INVENTION

The touch panel illustrated in FIG. 10 is formed by pressing the upper substrate 110 and the lower substrate 120 in the lamination direction in a state that the end portion 130A of the FPC 130 and the adhesion layer 140 are sandwiched between the upper substrate 110 and the lower substrate 120. As described above, the adhesion layer 140 is arranged between the wiring layers 113A and 113B and the wiring layers 123A and 123B. Thus, in pressing the upper substrate 110 and the lower substrate 120 in the lamination direction in the manufacturing process, concavity and convexity along the wiring layers 113A and 113B is generated on the contact face 110A of the upper substrate 110. As a result, there has been a disadvantage that in the case where the whole contact face 110A is used as part of a package of a device, flatness of the package surface is impaired.

In view of the foregoing, in the invention, it is desirable to provide a touch panel capable of decreasing the concavity and convexity generated on the surface and a display unit including the touch panel.

According to an embodiment of the invention, there is provided a touch panel including a first transparent substrate and a second transparent substrate arranged oppositely with a gap in between. In the touch panel of the embodiment of the invention, a first wiring layer is provided on a face opposed to the second transparent substrate of the first transparent substrate, and a first spacer layer is provided at least along both side faces of the first wiring layer. Meanwhile, a second wiring layer is provided on a face opposed to the first transparent substrate of the second transparent substrate, and a second spacer layer is provided at least along both side faces of the second wiring layer. An adhesion layer and a flexible printed circuit board are provided in the gap between the first transparent substrate and the second transparent substrate. The adhesion layer is provided in a region opposed to the first wiring layer, the second wiring layer, the first spacer layer, and the second spacer layer. The flexible printed circuit board is provided in a region including at least part of a region not provided with the adhesion layer in the region opposed to the first wiring layer, the second wiring layer, the first spacer layer, and the second spacer layer.

According to an embodiment of the invention, there is provided a display unit including a display panel having an image display face and the foregoing touch panel arranged on the image display face.

In the touch panel and the display unit of the embodiments of the invention, the first spacer layer is provided along both side faces of the first wiring layer provided on the upper face side of the adhesion layer, and the second spacer layer is provided along both side faces of the second wiring layer provided on the lower face side of the adhesion layer. Thereby, in the manufacturing process, in pressing the first transparent substrate and the second transparent substrate in the lamination direction, there is no possibility that the adhesion layer protrudes to the sides of the first spacer layer and is contacted with the first transparent substrate, or the adhesion layer protrudes to the sides of the second spacer layer and is contacted with the second transparent substrate. Thereby, in the case where at least one of the first transparent substrate and the second transparent substrate has flexibility, the transparent substrate having flexibility may be prevented from being pulled by the adhesion layer and being bent.

According to the touch panel and the display unit of the embodiment of the invention, the first spacer layer is provided along both side faces of the first wiring layer provided on the upper face side of the adhesion layer, and the second spacer layer is provided along both side faces of the second wiring layer provided on the lower face side of the adhesion layer. Thus, in the manufacturing process, in the case where at least one of the first transparent substrate and the second transparent substrate has flexibility, the transparent substrate having flexibility may be prevented from being pulled by the adhesion layer and being bent. Thereby, compared to a case where the adhesion layer protrudes to the sides of the first wiring layer and is contacted with the first transparent substrate, or the adhesion layer protrudes to the sides of the second wiring layer and is contacted with the second transparent substrate, concavity and convexity generated on the surface of the touch panel may be decreased. As a result, even in the case where the whole upper face of the transparent substrate is used as part of a package of a device, there is no possibility that flatness of the package surface is impaired.

Other and further objects, features and advantages of the invention will appear more fully from the following description.

DETAILED DESCRIPTION OF THE PREFERRED EMBODIMENT

A preferred embodiment of the invention (hereinafter simply referred to as embodiment) will be hereinafter described in detail with reference to the drawings.

Figure 1:
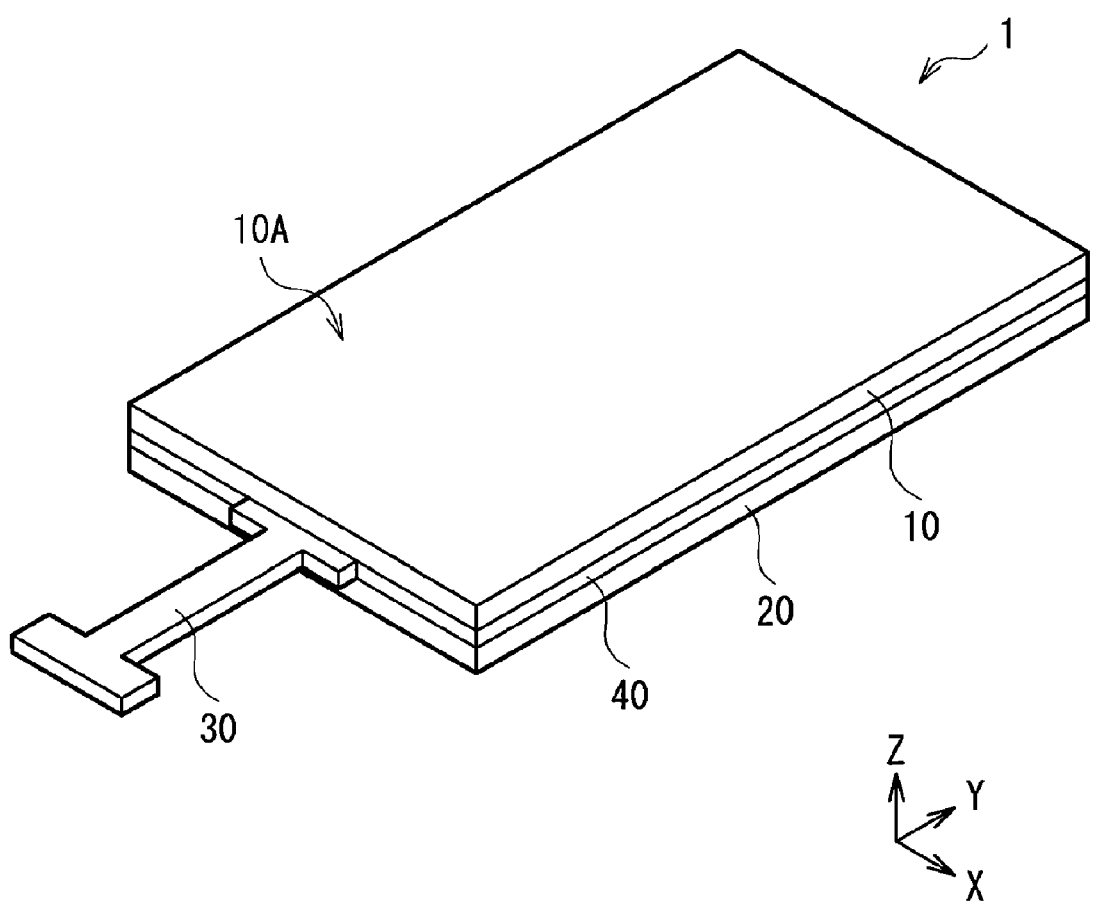
FIG. 1 is a perspective view of a touch panel according to an embodiment of the invention.
Figure 2:
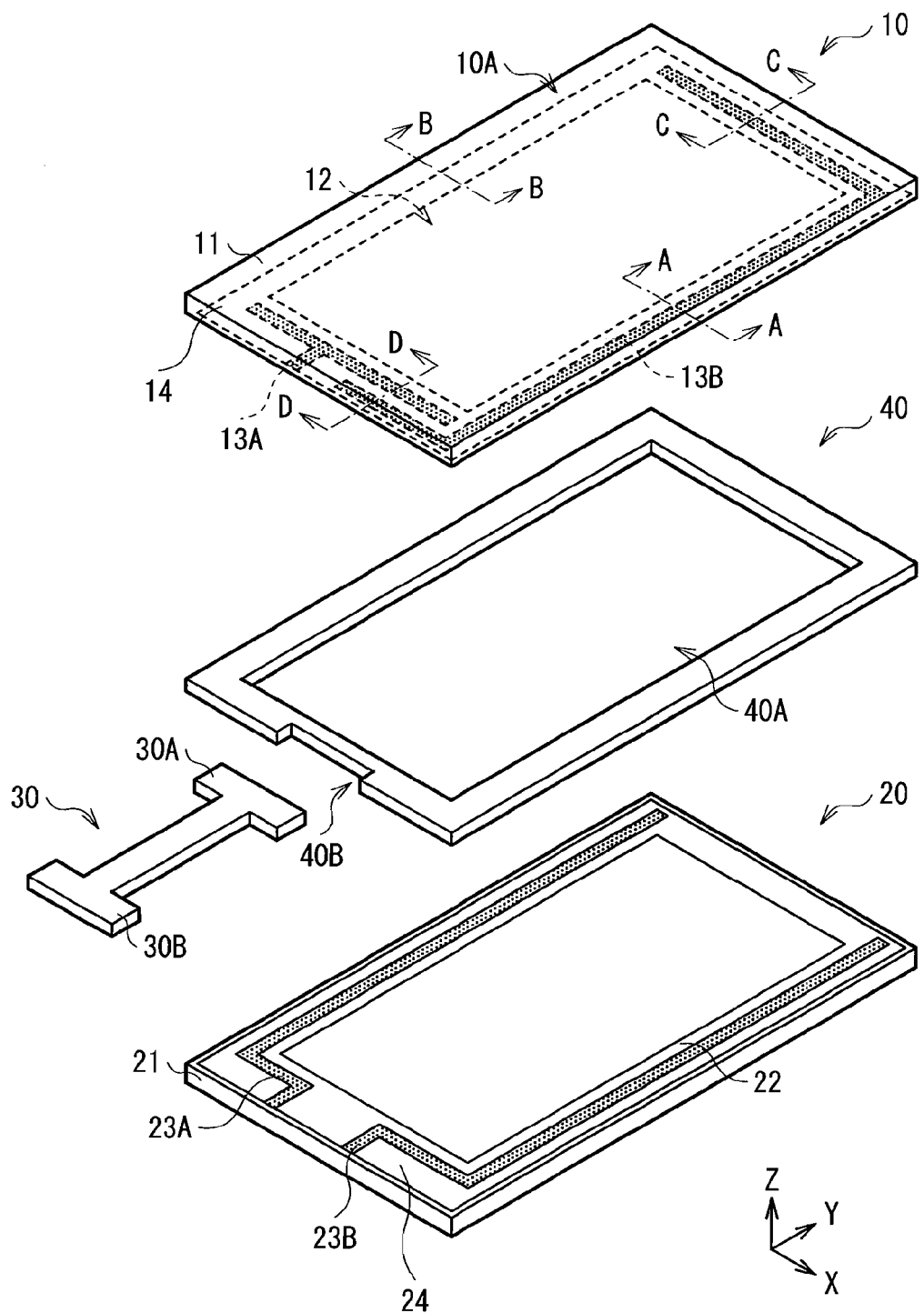
FIG. 2 is a development view of the touch panel of FIG. 1.
Figure 3A:
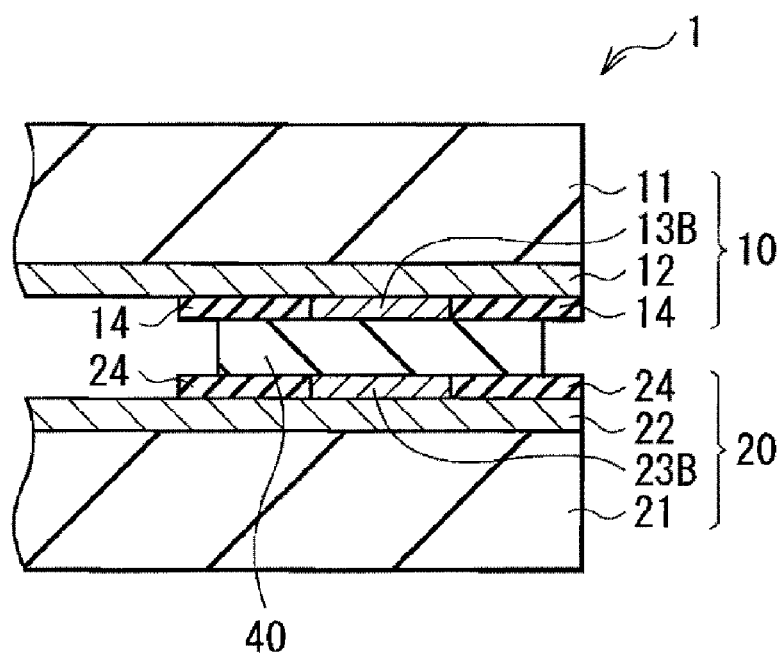
FIGS. 3A and 3B are cross sectional views taken along A-A and B-B of the touch panel of FIG. 2.
Figure 3B:
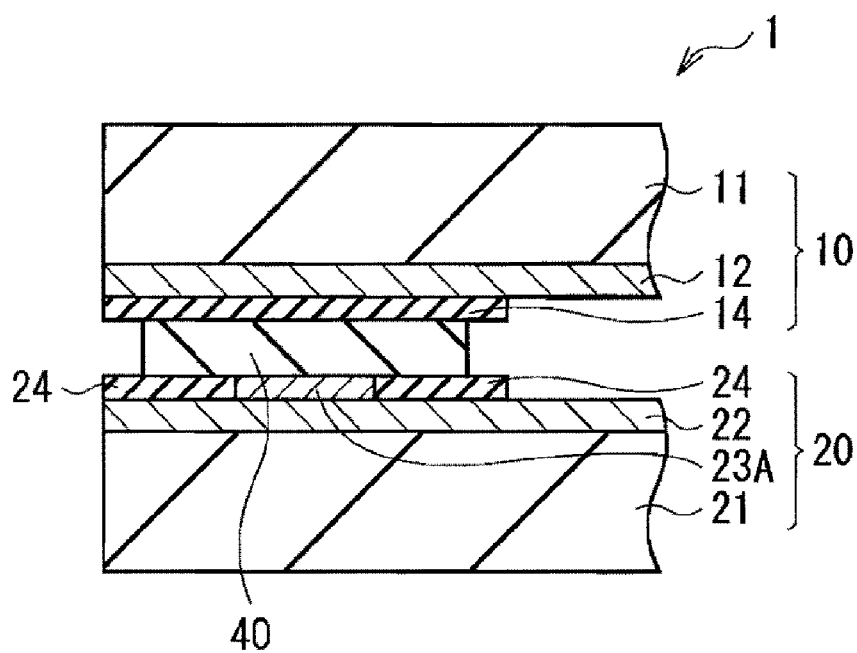
Figure 4A:
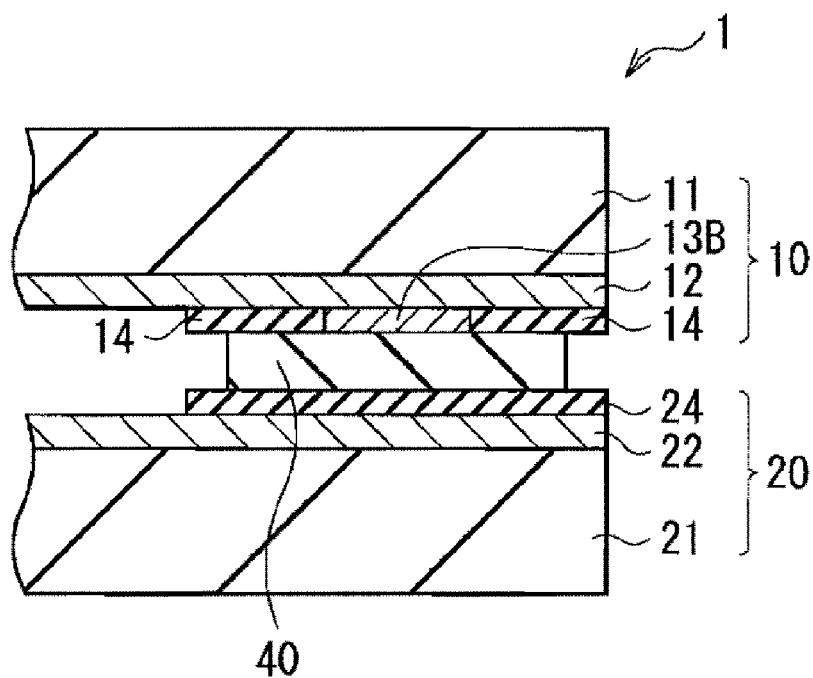
FIGS. 4A and 4B are cross sectional views taken along C-C and D-D of the touch panel of FIG. 2.
Figure 4B:
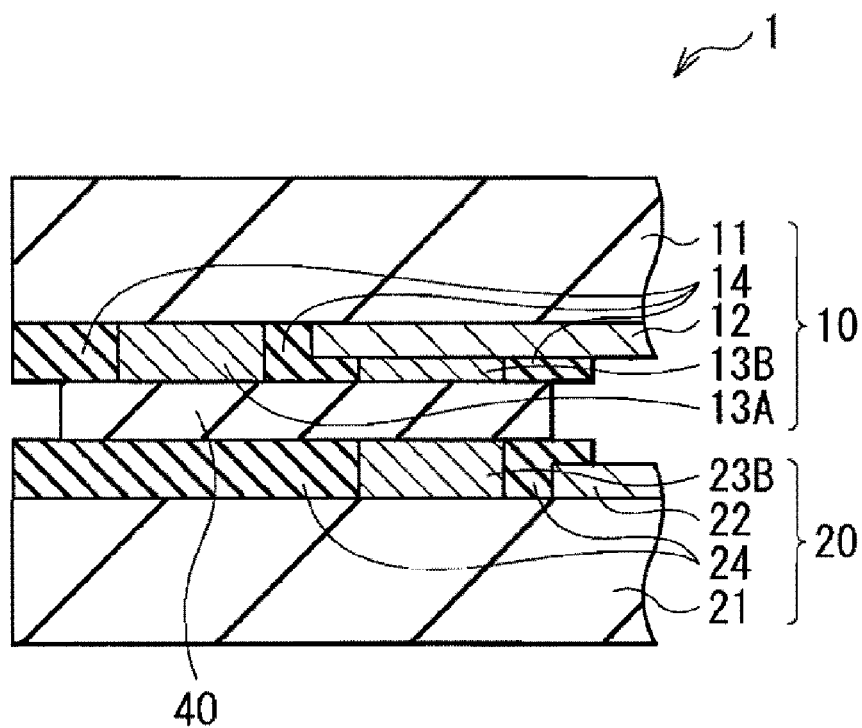

FIG. 1 is a perspective view illustrating a schematic configuration of a touch panel 1 according to an embodiment of the invention. FIG. 2 is an exploded view of the touch panel 1 of FIG. 1. FIG. 3A is a view illustrating a cross sectional configuration taken along A-A of an outer edge of the touch panel 1 of FIG. 2. FIG. 3B is a view illustrating a cross sectional configuration taken along B-B of the outer edge of the touch panel 1 of FIG. 2. FIG. 4A is a view illustrating a cross sectional configuration taken along C-C of the outer edge of the touch panel 1 of FIG. 2. FIG. 4B is a view illustrating a cross sectional configuration taken along D-D of the outer edge of the touch panel 1 of FIG. 2.

The touch panel 1 of this embodiment is placed on a display unit including, for example, a liquid crystal panel, an organic EL panel or the like, and is used as a screen input display unit. In the touch panel 1, selection of display on the display screen of the display unit and the like are directly operated by pressing the surface of the touch panel 1 with the use of a finger, a pen or the like. Examples of touch panel types include a resistive touch panel, a capacitance touch panel and the like. In this embodiment, a description will be given by exemplifying a case in which the invention is applied to the resistive touch panel.

The touch panel 1 includes, for example, as illustrated in FIG. 1 and FIG. 2, a pair of an upper substrate 10 and a lower substrate 20 arranged oppositely with a certain gap in between. Between the pair of the upper substrate 10 and the lower substrate 20, a flexible printed circuit board (FPC) 30 and an adhesion layer 40 are provided.

Figure 5:
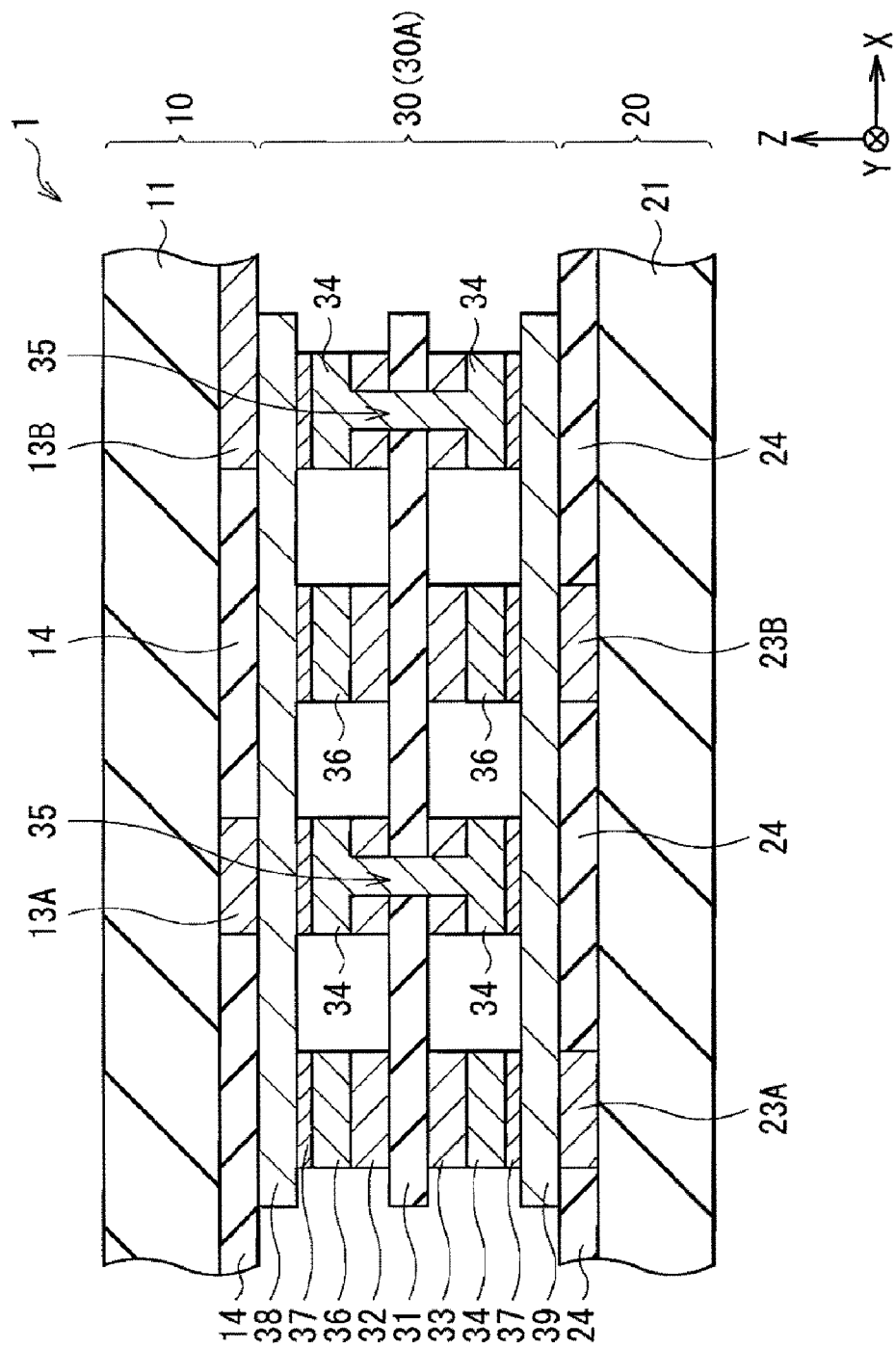
FIG. 5 is a cross sectional view of an end portion on the FPC side of the touch panel of FIG. 2.
Figure 6A:
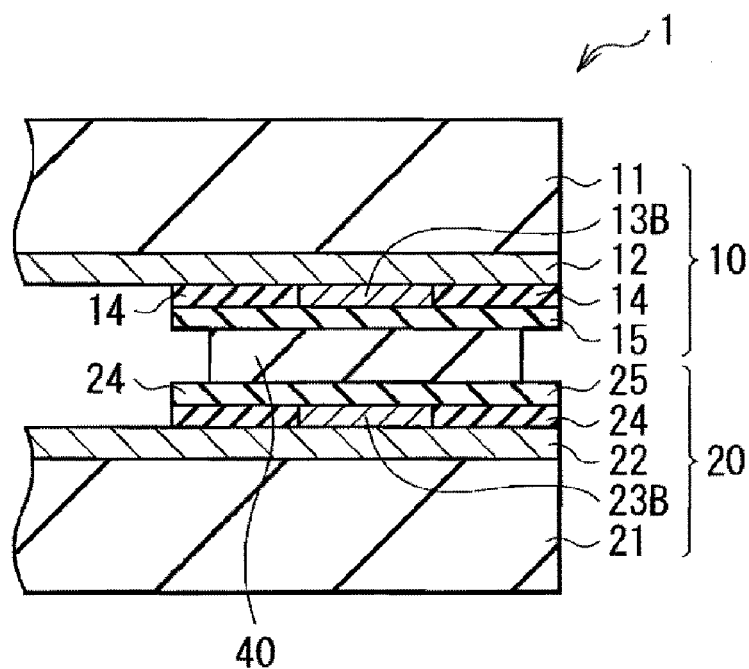
FIGS. 6A and 6B are cross sectional views taken along A-A and B-B of a modification of the touch panel of FIG. 2.
Figure 6B:
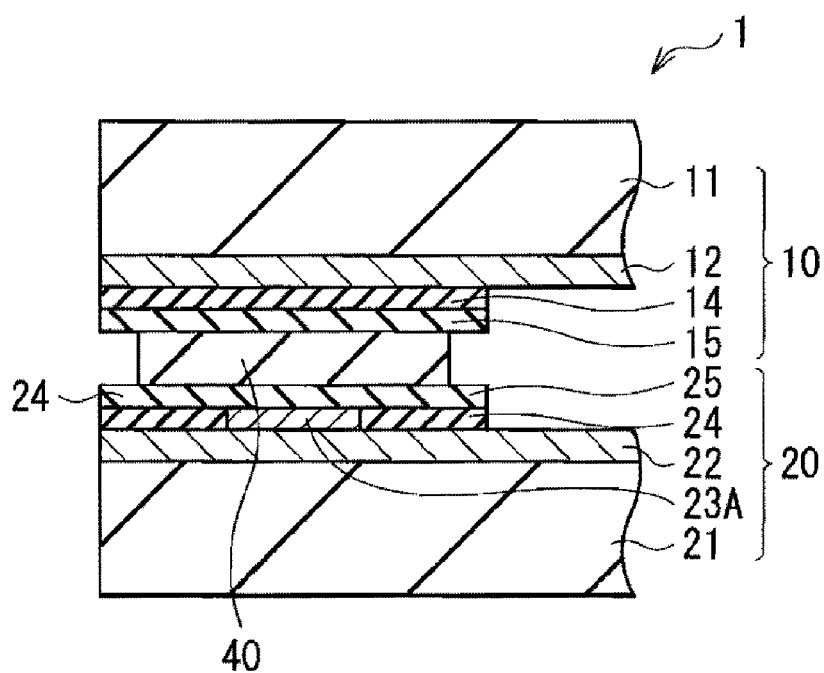
Figure 7A:
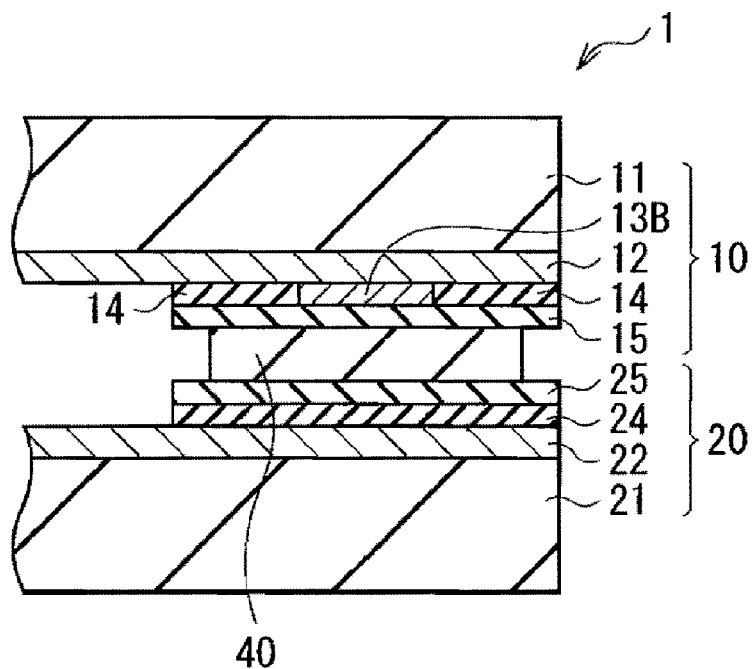
FIGS. 7A and 7B are cross sectional views taken along C-C and D-D of the modification of the touch panel of FIG. 2.
Figure 7B:
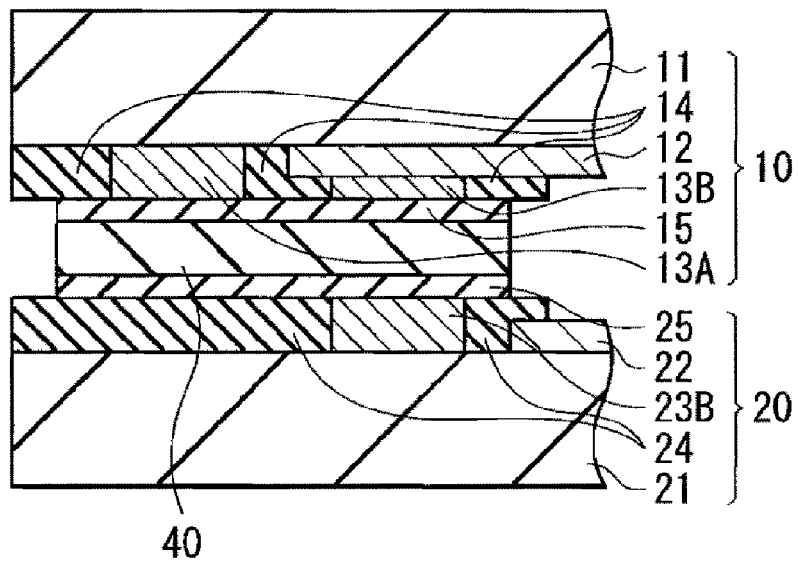

The upper substrate 10 has a transparent substrate 11 (first transparent substrate) as a contact face 10A to be contacted with a finger, a pen or the like. On the opposite face (lower face) of the contact face 10A of the transparent substrate 11, a resistive film 12 is provided. On the outer edge of the resistive film 12 of the lower face of the transparent substrate 11, for example, as illustrated in FIGS. 2, 3A, 3B, 4A, and 4B, strip-shaped wiring layers 13A and 13B (first wiring layer) and a spacer layer 14 (first spacer layer) are provided. The wiring layer 13A is linked to and electrically connected to an end of the resistive film 12, and, for example, as illustrated in FIG. 2, is in the shape of T. The wiring layer 13B is linked to and electrically connected to the other end of the resistive film 12, and, for example, as illustrated in FIG. 2, is in the shape of U. The spacer layer 14 prevents oxidation of the wiring layers 13A and 13B and planarize the adhesion face of the adhesion layer 40. The spacer layer 14 is formed in a region including a region where the wiring layers 13A and 13B are not formed in a region opposed to the adhesion layer 40. The spacer layer 14 is, for example, as illustrated in FIG. 2, in the shape of a ring. Further, the spacer layer 14 is formed at least along both side faces of the wiring layers 13A and 13B. For example, as illustrated in FIG. 2, the spacer layer 14 covers almost whole side faces of the wiring layers 13A and 13B. For example, as illustrated in FIGS. 2, 3A, 3B, 4A, and 4B, the spacer layer 14 may be contacted with the side faces of the wiring layers 13A and 13B, but may be arranged being slightly spaced from the side faces of the wiring layers 13A and 13B. Further, for example, as illustrated in FIGS. 3A, 3B, 4A, and 4B, the spacer layer 14 preferably has the same thickness as the thickness of the wiring layers 13A and 13B, but may have a thickness slightly different from the thickness of the wiring layers 13A and 13B. For example, as illustrated in FIG. 5, it is possible that each of one end of the wiring layers 13A, 13B, and the spacer layer 14 is provided in an end edge of the lower face of the transparent substrate 11 and in a region opposed to an end portion 30A of the FPC 30, and is contacted with an anisotropic conductive film 38 (described later) of the FPC 30. FIG. 5 is an enlarged view of a cross sectional structure in the vicinity of the end portion 30A of the FPC 30 in the touch panel 1.

The transparent substrate 11 is composed of, for example, a flexible transparent resin such as soft polyethylene terephthalate (PET), and has flexibility. The resistive film 12 is composed of, for example, Indium Tin Oxide (ITO) or the like. The wiring layers 13A and 13B are composed of, for example, silver (Ag) or the like. The spacer layer 14 is composed of, for example, a polymer resin such as epoxy acrylate or the like.

The lower substrate 20 has a transparent substrate 21 (second transparent substrate) that supports a resistive film 22 (described later) with which the resistive film 12 is to be contacted when a finger, a pen or the like is contacted with the upper substrate 10. For example, as illustrated in FIG. 2, the foregoing resistive film 22 is provided on a face (upper face) opposed to the upper substrate 10 of the transparent substrate 21 and in a region opposed to the resistive film 12. On the outer edge of the resistive film 22 of the upper face of the transparent substrate 21, for example, as illustrated in FIGS. 2, 3A, 3B, 4A, and 4B, strip-shaped wiring layers 23A and 23B (second wiring layer) and a spacer layer 24 (second spacer layer) are provided. The wiring layer 23A is linked to and electrically connected to an end of the resistive film 22, and, for example, as illustrated in FIG. 2, is approximately in the shape of L. The wiring layer 23B is linked to and electrically connected to the other end of the resistive film 22, and, for example, as illustrated in FIG. 2, is approximately in the shape of reversed L. The spacer layer 24 is formed in a region including a region where the wiring layers 23A and 23B are not formed in a region opposed to the adhesion layer 40. The spacer layer 24 is, for example, as illustrated in FIG. 2, in the shape of a ring. Further, the spacer layer 24 is formed at least along both side faces of the wiring layers 23A and 23B. For example, as illustrated in FIG. 2, the spacer layer 24 covers almost whole side faces of the wiring layers 23A and 23B. For example, as illustrated in FIGS. 2, 3A, 3B, 4A, and 4B, the spacer layer 24 may be contacted with the side faces of the wiring layers 23A and 23B, but may be arranged being slightly spaced from the side faces of the wiring layers 23A and 23B. Further, for example, as illustrated in FIGS. 3A, 3B, 4A, and 4B, the spacer layer 24 preferably has the same thickness as the thickness of the wiring layers 23A and 23B, but may have a thickness slightly different from the thickness of the wiring layers 23A and 23B. For example, as illustrated in FIG. 5, it is possible that each of one end of the wiring layers 23A, 23B, and the spacer layer 24 is provided in an edge of the upper face of the transparent substrate 21 and in a region opposed to the end portion 30A of the FPC 30, and is contacted with an anisotropic conductive film 39 (described later) of the FPC 30.

The transparent substrate 21 is composed of, for example, a flexible transparent resin such as soft polyethylene terephthalate (PET), a hard transparent resin material such as an acryl plate, hard transparent glass or the like. In the case where the transparent substrate 21 is composed of the flexible transparent resin, the transparent substrate 21 has flexibility. The resistive film 22 is composed of, for example, Indium Tin Oxide (ITO) or the like. The wiring layers 23A and 23B are composed of, for example, silver (Ag) or the like. The spacer layer 24 is composed of, for example, a polymer resin such as epoxy acrylate or the like.

The adhesion layer 40 is in the shape of a ring having an aperture 40A in a region opposed to the resistive films 12 and 22, and is arranged along the outer edge of the resistive films 12 and 22. The adhesion layer 40 is formed at least in a region opposed to the wiring layers 13A, 13B, 23A, and 23B. For example, the adhesion layer 40 is formed in a region opposed to the wiring layer 13A and the spacer layer 14, in a region opposed to the wiring layer 13B and the spacer layer 14, in a region opposed to the wiring layer 23A and the spacer layer 24, and in a region opposed to the wiring layer 13B and the spacer layer 24. Thereby, the adhesion layer 40 insulates the wiring layers 13A and 13B from the wiring layers 23A and 23B, and adheres the upper substrate 10 and the lower substrate 20. The adhesion layer 40 has a notch 40B in a region opposed to the PFC 30, and is not overlapped with the FPC 30 viewed from the thickness direction. The adhesion layer 40 is made of, for example, a double-faced tape.

The FPC 30 has a strip-shaped base film 31 extending in one direction as illustrated in FIG. 2 and FIG. 5. As illustrated in FIG. 2, the base film 31 has a pair of the end portions 30A and 30B opposed to each other in the extending direction of the base film 31. The end portion 30A has, for example, a width wider than the width of a central portion of the base film 31, and is sandwiched between the pair of transparent substrates 11 and 21. Meanwhile, the end portion 30B has, for example, a width wider than the width of the central portion of the base film 31 as the end portion 30A does, and is connectable to a device (not illustrated) for processing an output signal from the touch panel 1. The base film 31 is, for example, composed of polyimide or the like.

On the surface on the lower substrate 20 side of the base film 31, for example, four wiring layers 33 made of, for example, a copper foil or the like are provided. The four wiring layers 33 are formed to abut on the surface on the lower substrate 20 side of the base film 31, and are formed in the same plane as each other. Further, the four wiring layers 33 are formed linearly from the end portion 30A to the end portion 30B. Furthermore, each of the end portions on the end portion 30A side of the four wiring layers 33 is in the shape of a pad, and portions other than the end portions on the end portion 30A side of the four wiring layers 33 have a width slightly narrower than the width of the end portions on the end portion 30A side of the four wiring layers 33.

On the surface on the upper substrate 10 side of the base film 31, for example, four wiring layers 32 made of, for example, a copper foil or the like are provided. The four wiring layers 32 are formed to abut on the surface on the upper substrate 10 side of the base film 31, and are formed in the same plane as each other. Further, each of the end portions on the end portion 30A side of the four wiring layers 32 is in the shape of a pad. Therefore, for the FPC 30 of this embodiment, a flexible substrate having a double-sided structure in which a conductor pattern is formed on both faces is used.

Further, in the FPC 30, for example, two through holes 35 passing through the end portion 30A of the base film 31 and the wiring layers 32 and 33 are formed. Out of the four wiring layers 33, two wiring layers provided in a region opposed to the wiring layers 23A and 23B (hereinafter referred to as "wiring layer 33 not being contacted with the through hole") extend from the end portion 30A to the end portion 30B to avoid the through hole 35. Further, out of the four wiring layers 33, two wiring layers provided in a region opposed to the wiring layers 13A and 13B (hereinafter referred to as "wiring layer 33 being contacted with the through hole") extend from the end portion 30A to the end portion 30B and are contacted with the through hole 35. The thickness of the wiring layer 33 not being contacted with the through hole is, for example, almost the same as the thickness of the wiring layer 33 being contacted with the through hole. Meanwhile, out of the four wiring layers 32, two wiring layers provided in a region opposed to the wiring layers 23A and 23B (hereinafter referred to as "wiring layer 32 not being contacted with the through hole") are formed in the end portion 30A to avoid the through hole 35. Further, out of the four wiring layers 32, two wiring layers provided in a region opposed to the wiring layers 13A and 13B (hereinafter referred to as "wiring layer 32 being contacted with the through hole") are contacted with the through hole 35. The thickness of the wiring layer 32 not being contacted with the through hole is, for example, almost the same as the thickness of the wiring layer 32 being contacted with the through hole.

Further, for example, a plated layer 34 is formed in the through hole 35 and on the surface in the vicinity of the through hole 35 of the wiring layers 32 and 33 being contacted with the through hole. Further, for example, a plated layer 36 is formed on the surface of the end portion 30A of the wiring layers 32 and 33 not being contacted with the through hole. The plated layer 36 is collectively formed at the same time as the time when the plated layer 34 is formed in the manufacturing process. The thickness of the plated layer 36 is almost the same as the thickness of the portion formed on the surface of the wiring layers 32 and 33 of the plated layer 34. On the surface of the plated layers 34 and 36, a plated layer 37 is formed.

On the surface on the plated layer 37 side of the transparent substrate 11, the anisotropic conductive film 38 is formed. The anisotropic conductive film 38 is contacted with the end portions of the wiring layers 13A and 13B and the spacer layer 14. Meanwhile, on the surface on the plated layer 37 side of the transparent substrate 21, the anisotropic conductive film 39 is formed. The anisotropic conductive film 39 is contacted with the end portions of the wiring layers 23A and 23B and the spacer layer 24.

The anisotropic conductive films 38 and 39 are made of, for example, a sheet-like anisotropic conductive film (ACF) or the like, has electric conductivity in the thickness direction, and has insulation property in the direction orthogonal to the thickness. Therefore, as illustrated in FIG. 5, even if the anisotropic conductive film 38 is physically contacted with the wiring layers 13A and 13B, electricity is not conducted in the in-plane direction of the anisotropic conductive film 38. Similarly, even if the anisotropic conductive film 39 is physically contacted with the wiring layers 23A and 23B, electricity is not conducted in the in-plane direction of the anisotropic conductive film 39. As a result, the wiring layer 13A is electrically connected only with the plated layer 37 opposed to the wiring layer 13A with the anisotropic conductive film 38 in between, and the wiring layer 13B is electrically connected only with the plated layer 37 opposed to the wiring layer 13B with the anisotropic conductive film 38 in between. Further, the wiring layer 23A is electrically connected only with the plated layer 37 opposed to the wiring layer 23A with the anisotropic conductive film 39 in between, and the wiring layer 23B is electrically connected only with the plated layer 37 opposed to the wiring layer 23B with the anisotropic conductive film 39 in between.

Therefore, in the touch panel 1, the two wiring layers 13A and 13B linked to the resistive film 12 on the transparent substrate 11 side are electrically connected with the two wiring layers 33 being contacted with the through hole via the through hole 35 provided in the base film 31 and the wiring layers 32 and 33. Further, the two wiring layers 23A and 23B linked to the resistive film 22 on the transparent substrate 21 side are electrically connected with the two wiring layers 33 not being contacted with the through hole, not via the through hole 35, but via the anisotropic conductive film 39 and the plated layers 34 and 37.

Though not illustrated, an isotropic conductive film may be used instead of the anisotropic conductive films 38 and 39. However, in this case, electricity is conducted in the in-plane direction of the conductive film. Thus, it is necessary to separately provide the conductive film for every wiring layer.

Further, in FIG. 2 and FIG. 5, portions contacted with the anisotropic conductive films 38 and 39 in the wiring layers 13A, 13B, 23A, and 23B are lined in the order of the wiring layer 23A, the wiring layer 13A, the wiring layer 23B, and the wiring layer 13B in the X-axis direction in the drawings. However, the portions may be lined in the order different from the foregoing order. For example, the portions contacted with the anisotropic conductive films 38 and 39 in the wiring layers 13A, 13B, 23A, and 23B may be lined in the order of the wiring layer 23A, the wiring layer 23B, the wiring layer 13A, and the wiring layer 13B in the X-axis direction.

Next, a description will be given of an example of a method of manufacturing the touch panel 1 of this embodiment.

First, on a face of the transparent substrates 11 and 21, the resistive films 12 and 22 composed of ITO are respectively formed by a known method such as sputtering method. After that, on the outer edge of the resistive films 12 and 22 of the transparent substrates 11 and 21, the wiring layers 13A, 13B, 23A, and 23B composed of Ag are formed by a known method such as screen printing method. Subsequently, the spacer layers 14 and 24 composed of a polymer resin such as epoxy acrylate are respectively formed on the outer edge of the resistive films 12 and 22 of the transparent substrates 11 and 21 and adjacently to both side faces of the wiring layers 13A, 13B, 23A, and 23B by a known method such as screen printing method. The width of the spacer layers 14 and 24 is determined to the degree so that in the after-mentioned pressing step, the adhesion layer 40 is prevented from protruding to the sides of the spacer layers 14 and 24 and being contacted with the transparent substrates 11 and 21 and the resistive films 12 and 22. Accordingly, the upper substrate 10 and the lower substrate 20 are formed.

Next, the lower substrate 20 is placed on a base with the resistive film 22 side up. The adhesive layer 40 in the shape of a ring is arranged on the outer edge of the resistive film 22 of the lower substrate 20 and on the surface of the wiring layers 23A and 23B and the spacer layer 24. After that, the upper substrate 10 with the resistive film 12 side down is arranged over the lower substrate 20 with the adhesion layer 40 in between, and the upper substrate 10 and the lower substrate 20 are adhered with the adhesion layer 40. At this time, the upper substrate 10 is arranged over the lower substrate 20 so that the upper face of the adhesion layer 40 is contacted with the surface of the wiring layers 13A and 13B and the spacer layer 14.

Next, the end portion 30A of the FPC 30 is inserted into the notch 40B of the adhesion layer 40. After that, the end portion 30A is pressed by a pressure bonding head. The wiring layers 13A, 13B and an ACF layer (layer to subsequently become the anisotropic conductive film 38) are pressure-bonded, and the wiring layers 23A, 23B and an ACF layer (layer to subsequently become the anisotropic conductive film 39) are pressure-bonded. Thereby, the ACF layers become the anisotropic conductive films 38 and 39. Thus, the wiring layer 13A is electrically connected only with the plated layer 37 opposed to the wiring layer 13A via the anisotropic conductive film 38, the wiring layer 13B is electrically connected only with the plated layer 37 opposed to the wiring layer 13B via the anisotropic conductive film 38, the wiring layer 23A is electrically connected only with the plated layer 37 opposed to the wiring layer 23A via the anisotropic conductive film 39, and the wiring layer 23B is electrically connected only with the plated layer 37 opposed to the wiring layer 23B via the anisotropic conductive film 39. Accordingly, the touch panel 1 of this embodiment is manufactured.

In the touch panel 1 of this embodiment, the spacer layer 14 is formed along both side faces of the wiring layers 13A and 13B provided on the upper face side of the adhesion layer 40. In addition, the spacer layer 24 is formed along both side faces of the wiring layers 23A and 23B provided on the lower face side of the adhesion layer 40. Further, the width of the spacer layers 14 and 24 is determined to the degree so that in the manufacturing process, the adhesion layer 40 is prevented from protruding to the sides of the spacer layers 14 and 24 and being contacted with the transparent substrates 11 and 21 and the resistive films 12 and 22. Thereby, it is possible to eliminate possibility that in pressing the transparent substrate 11 and the transparent substrate 21 in the lamination direction, the adhesion layer 40 protrudes to the sides of the spacer layers 14 and 24 and is contacted with the transparent substrates 11 and 21 and the resistive films 12 and 22 in the manufacturing process. As a result, in the case where at least one of the transparent substrates 11 and 21 has flexibility, the transparent substrate having flexibility is able to be prevented from being pulled by the adhesion layer 40 and being bent. Therefore, compared to a case where the adhesion layer 40 protrudes to the sides of the spacer layers 14 and 24 and is contacted with the transparent substrates 11 and 21 and the resistive films 12 and 22, concavity and convexity generated on the surface of the touch panel 1 is able to be decreased. Therefore, even in the case where the whole upper face of the transparent substrate 11 is used as part of a package of a device, there is no possibility that flatness of the package surface is impaired.

Modification

In the foregoing embodiment, the adhesion layer 40 is directly contacted with the wiring layers 13A and 13B and the spacer layer 14 of the upper substrate 10, and is directly contacted with the wiring layers 23A and 23B and the spacer layer 24 of the lower substrate 20. However, for example, as illustrated in FIGS. 6A, 6B, 7A, and 7B, the adhesion layer 40 may be contacted with the wiring layers 13A and 13B and the spacer layer 14 of the upper substrate 10, and may be contacted with the wiring layers 23A and 23B and the spacer layer 24 of the lower substrate 20 respectively with middle layers 15 and 25 (a first middle layer and a second middle layer) in between. In this case, it is possible that the middle layer 15 eliminates a slight step existing between the wiring layer 13A/13B and the spacer layer 14, and the middle layer 25 eliminates a slight step existing between the wiring layer 23A/23B and the spacer layer 24. Thus, the contact face 10A is possible to be more planarized.

Application Example

Figure 8:
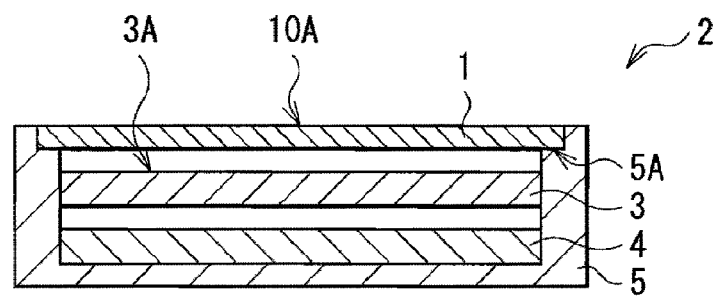
FIG. 8 is a cross sectional view of a display unit according to an application example.
Figure 9:
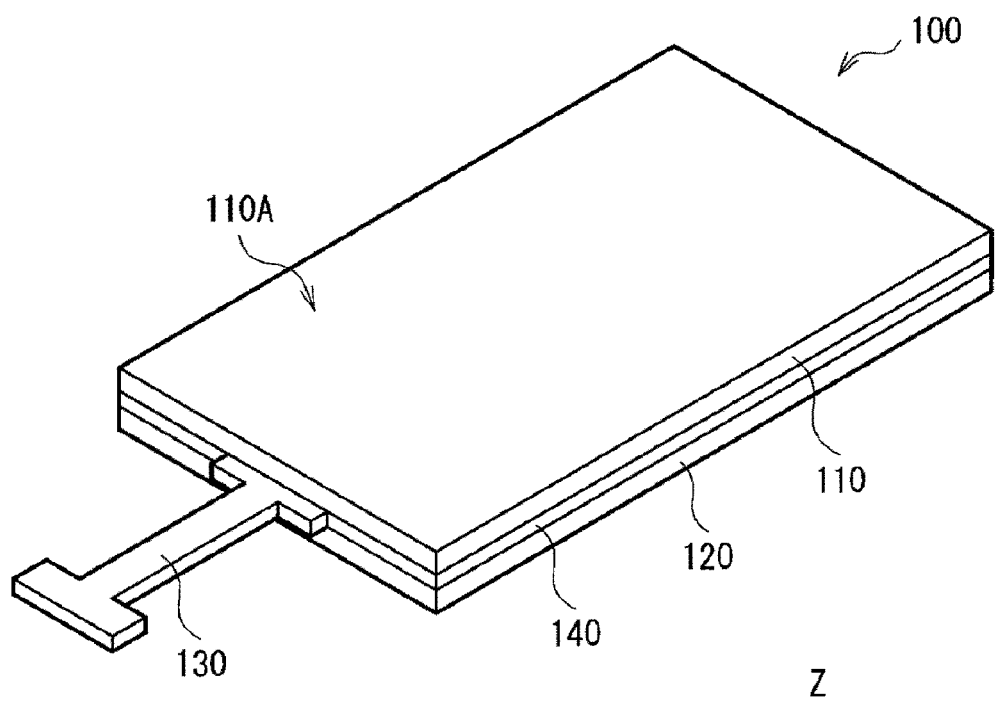
FIG. 9 is a perspective view of a touch panel of related art.
Figure 10:
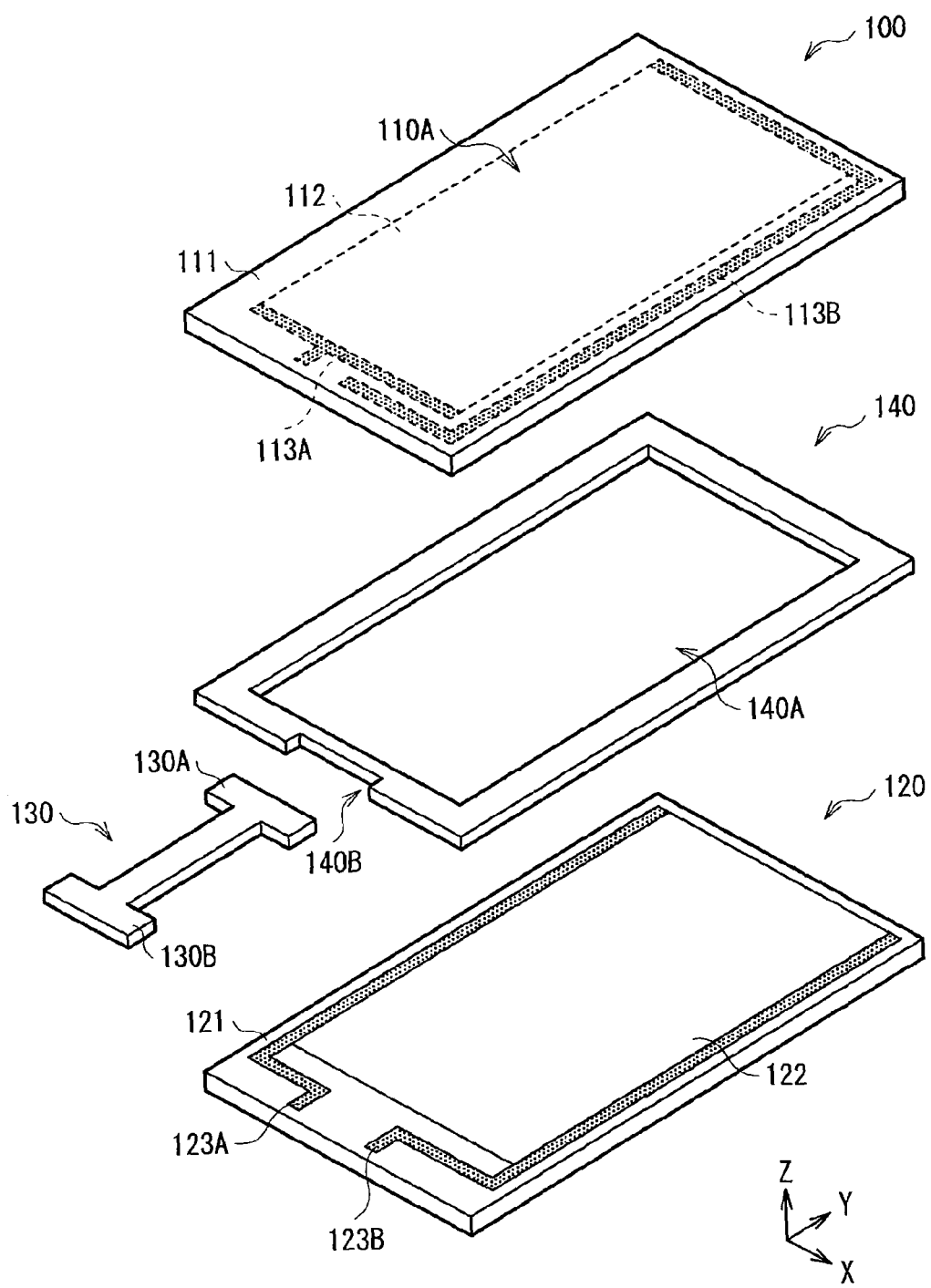
FIG. 10 is a development view of the touch panel of FIG. 9.

FIG. 8 illustrates an application example in the case where the touch panel 1 according to the embodiment is applied to a display unit. A display unit 2 in FIG. 8 includes a display panel 3 (a liquid crystal panel or an organic EL panel) having a screen display face 3A, the touch panel 1 arranged on the screen display face 3A, a backlight 4 arranged on the rear face of the display panel 3, and a package 5 supporting the display panel 3, the touch panel 1, and the backlight 4. In this application example, the touch panel 1 according to the embodiment is used. Thus, as illustrated in FIG. 8, even if the touch panel 1 is fixed on a concave section 5A of the package 5, and the whole contact face 10A of the touch panel 1 is used as part of the package 5, almost no concavity and convexity exists on the contact face 10A. Therefore, there is no possibility that flatness of the package surface is impaired. The present application contains subject matter related to that disclosed in Japanese Priority Patent Application JP 2008-194545 filed in the Japan Patent Office on Jul. 29, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalents thereof.

What is claimed is:

1. A touch panel comprising:
a first transparent substrate and a second transparent substrate arranged in opposition with a gap in between;
a first wiring layer provided on a face of the first transparent substrate facing the second substrate;
a second wiring layer provided on a face of the second transparent substrate facing the first substrate;
a first spacer layer provided on the face of the first substrate facing the second substrate and so as to flank oppositely facing side faces of the first wiring layer;
a second spacer layer provided on the face of the second substrate facing the first substrate and so as to flank oppositely facing side faces of the second wiring layer;
an adhesion layer provided in the gap between the first transparent substrate and the second transparent substrate and in a region between surfaces of the first wiring layer and the first spacer layer respectively facing the second wiring layer and the second spacer layer; and
a flexible printed circuit board provided in the gap between the first transparent substrate and the second transparent substrate and in a region including at least part of a region not provided with the adhesion layer in the region between the surfaces of the first wiring layer and the first spacer layer respectively facing the second wiring layer and the second spacer layer.

2. The touch panel according to claim 1 comprising:
a first middle layer provided between (a) the adhesion layer and (b) each of the first wiring and the first spacer layer; and
a second middle layer provided between (a) the adhesion layer and (b) each of the second wiring layer and the second spacer layer.

3. A display unit comprising:
a display panel having an image display face; and
a touch panel arranged at the image display face,
wherein the touch panel includes
   (a) a first transparent substrate and a second transparent substrate arranged in opposition with a gap in between,
   (b) a first wiring layer provided on a face of the first transparent substrate facing the second substrate,
   (c) a second wiring layer provided on a face of the second transparent substrate facing the first substrate,
   (d) a first spacer layer provided on the face of the first substrate facing the second substrate and so as to flank oppositely facing side faces of the first wiring layer,
   (e) a second spacer layer provided on the face of the second substrate facing the first substrate and so as to flank oppositely facing side faces of the second wiring layer,
   (f) an adhesion layer provided in the gap between the first transparent substrate and the second transparent substrate and in a region between surfaces of the first wiring layer and the first spacer layer respectively facing the second wiring layer and the second spacer layer, and
   (g) a flexible printed circuit board provided in the gap between the first transparent substrate and the second transparent substrate and in a region including at least part of a region not provided with the adhesion layer in the region between the surfaces of the first wiring layer and the first spacer layer respectively facing the second wiring layer and the second spacer layer.

* * * * *